(12) United States Patent  
Katoh

(10) Patent No.: US 6,426,011 B1  
(45) Date of Patent: Jul. 30, 2002

(54) METHOD OF MAKING A PRINTED CIRCUIT BOARD

(75) Inventor: Takashi Katoh, Shigan-ken (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/540,412

(22) Filed: Mar. 31, 2000

(30) Foreign Application Priority Data

Apr. 2, 1999 (JP) .......................................... 11-095919

(51) Int. Cl.⁷ ................................................ H05K 3/42
(52) U.S. Cl. .............................. 216/19; 216/20; 216/39; 216/52; 216/105; 438/690; 438/696; 438/754; 438/759; 438/678; 438/687; 427/97; 427/98
(58) Field of Search .............................. 216/13, 18, 19, 216/20, 39, 52, 83, 92, 95, 105; 438/690, 691, 696, 745, 754, 459, 622, 625, 626, 628, 637, 639, 678, 687; 427/96, 97, 98

(56) References Cited

U.S. PATENT DOCUMENTS

| 4,233,344 A | * | 11/1980 | Brasch ........................ 427/304 |
| 4,810,333 A | * | 3/1989 | Gulla et al. ................... 204/15 |
| 4,847,114 A | * | 7/1989 | Brasch et al. ................. 427/96 |
| 4,976,990 A | * | 12/1990 | Bach et al. .................... 427/98 |
| 5,108,786 A | * | 4/1992 | Bayes .......................... 427/98 |
| 5,425,873 A | * | 6/1995 | Blandon et al. ............. 205/126 |
| 5,483,984 A |   | 1/1996 | Donlan, Jr. et al. |
| 5,648,125 A | * | 7/1997 | Cane .......................... 427/534 |
| 5,887,345 A | * | 3/1999 | Kulesza et al. ............... 29/852 |
| 6,013,417 A | * | 1/2000 | Sebesta et al. .............. 430/312 |
| 6,212,769 B1 | * | 4/2001 | Boyko et al. ................. 29/852 |
| 6,264,851 B1 | * | 7/2001 | Markovich et al. ........... 216/39 |

FOREIGN PATENT DOCUMENTS

JP 06302963 10/1994  
JP 10190221 7/1998

* cited by examiner

Primary Examiner—Randy Gulakowski  
Assistant Examiner—J Smetama  
(74) Attorney, Agent, or Firm—Lawrence R. Fraley

(57) ABSTRACT

A method of making a printed circuit board whereby a fine wiring pattern can be formed. A through hole is formed in a substrate, both surfaces of the substrate being covered with copper foil. The substrate is treated with a catalyst and plated with copper. The through hole is filled with an insulating material, and the copper layer on the substrate is etched so that the catalyst layer is not exposed, leaving a thinned copper layer. Then, the substrate surfaces are ground and leveled by removing any projecting insulating material. Thereafter, another copper layer is deposited on the surface of the substrate, including surface regions on the fill material and is circuitized to form a wiring pattern. Since the catalyst layer is not exposed when the copper layer on the substrate is thinned, a fine wiring pattern can be obtained without the problem of subsequent peeling of the wiring conductors, or the entrapment of air.

14 Claims, 3 Drawing Sheets

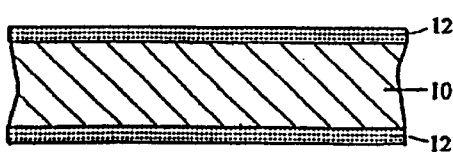
FIG. 2(A)
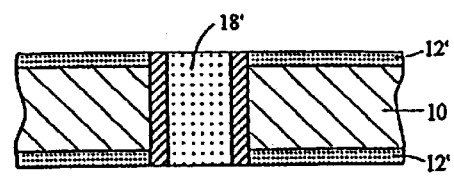
FIG. 2(D-2)
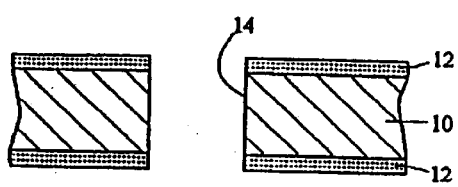
FIG. 2(B)
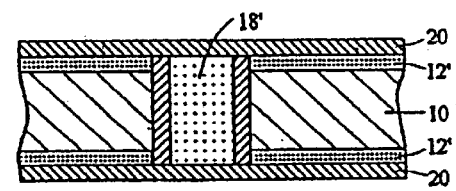
FIG. 2(E)
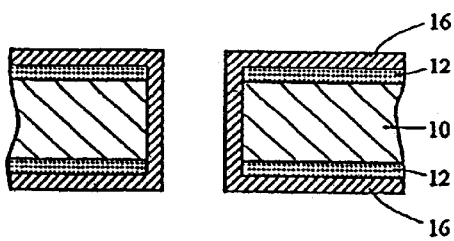
FIG. 2(C)
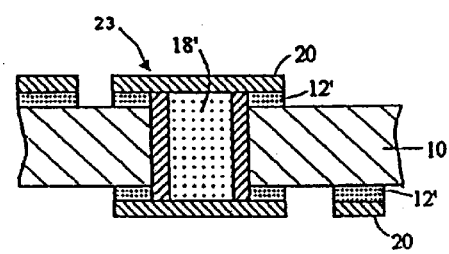
FIG. 2(F)
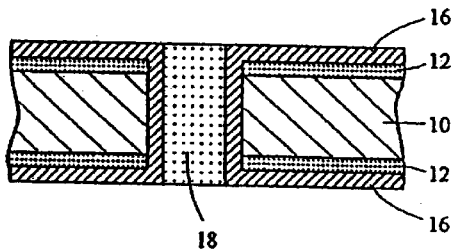
FIG. 2(D)
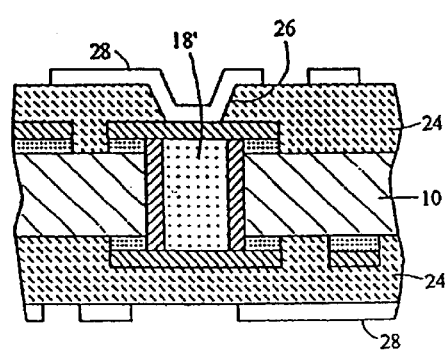
FIG. 2(G)
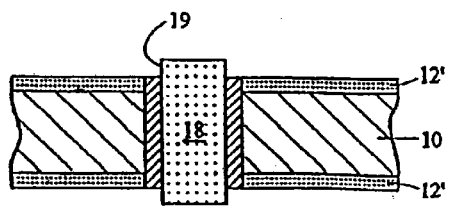
FIG. 2(D-1)

METHOD OF MAKING A PRINTED CIRCUIT BOARD

FIELD OF THE INVENTION

The present invention relates to a method of making a printed circuit board, and more particularly to a method of making a printed circuit board which enables the formation of a fine wiring pattern on the board's substrate.

BACKGROUND OF THE INVENTION

FIGS. 1(A)–1(G) are diagrams showing a conventional method for fabricating a printed circuit board. FIG. 1(A) will hereinafter be referred to as "step (A)", FIG. 1(B) as "step (B)", etc. in the following description prior to the description of FIGS. 2 and 3. First, in step (A), a substrate 10 having a metal layer 12 (e.g., copper foil) on each of the surfaces thereof is prepared, and in step (B), a through hole 14 is formed in the substrate 10, including through the copper foil. Then, in step (C), plating is performed to deposit a metal film 16 (e.g., copper) on the surfaces of the inner wall of the through hole 14 and the copper foil 12. In step (D), the through hole 14 is filled with an insulating material 18, such as a resin. Then, in step (E), plating is again performed to deposit a film 20 (e.g., copper) on the surfaces of the substrate 10, including the top and bottom surfaces of the resin in through hole 14. In step (F), the copper films 12, 16 and 20 on the substrate 10 are patterned or circuitized to form a wiring pattern 23. Following this, in step (G), a resin layer 24 is applied on the surfaces of the substrate 10, and is patterned to form a via 26 as needed. Again, copper plating is performed to deposit a copper film on the resin layers 24 and is patterned to form a wiring pattern 28. By repeating the application of the resin layer, and the plating and patterning of the copper film as needed, a wiring structure having multiple thin wiring layers can be provided.

According to the above conventional method, since the total thickness of the external copper material (layer) in step (E) is the total thickness of the individual copper films 12, 16 and 20, this copper layer cannot be finely patterned. If one tries to form a fine circuit pattern with small line-to-line spacings (gaps), the copper layer may be incompletely etched, as is indicated by a portion 22 in Step F. As a result, a short-circuit may occur in the wiring pattern. Further, in step (G), when the resin layer 24 is applied, air may be trapped in a small gap between the wiring conductors, such that an air bubble 30 may be formed. Such an air bubble may impair continuity of the resin layer 24 and its insulating properties. It has been found that such air entrapment is more likely to occur when the total thickness of the copper layer is greater than 25 $\mu$m.

OBJECTS AND SUMMARY OF THE INVENTION

It is, therefore, one object of the present invention to provide a method of making a printed circuit board in which a fine wiring pattern can be formed.

It is another object of the present invention to provide such a method of making a printed circuit board which can be performed in a facile manner.

According to one aspect of the invention, there is provided a method of making a printed circuit board comprising the steps of preparing a substrate having at least two opposing surfaces, providing an initial copper layer on each of the opposing surfaces, forming through holes, each having inner walls, in the substrate, treating the substrate with a catalyst to form a catalyzed layer on the substrate, including the inner walls of the through holes, and then plating the treated surfaces of the substrate with copper. The through holes are then filled with an insulating material, followed by thinning the copper layer on the at least one surface so that no part of the catalyst layer is exposed on the surface, removing any insulating material projecting from the surface of the thinned copper layer to thereby level the at least one surface, plating the at least one surface of the substrate and the insulating material with copper, and patterning the copper layer on the at least one surface to form a first wiring pattern.

BRIEF DESCRIPTION OF THE DRAWINGS

FIGS. 2(A)–2(G) are diagrams showing a method for fabricating a printed circuit board according to one embodiment of the present invention.

BEST MODE FOR CARRYING OUT THE INVENTION

Figure 1A:
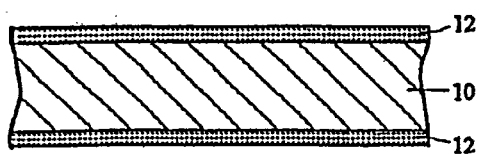
FIGS. 1(A)–1(G) are diagrams showing a conventional method for fabricating a printed circuit board.
Figure 1B:
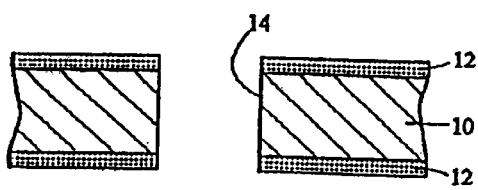
Figure 1C:
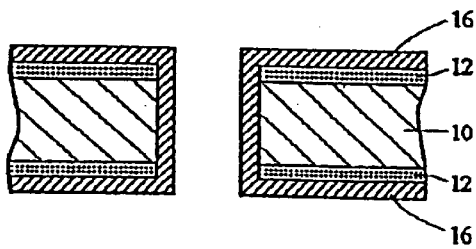
Figure 1D:
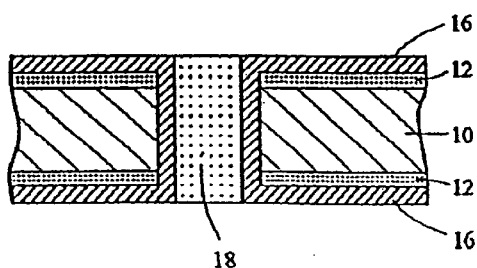
Figure 1E:
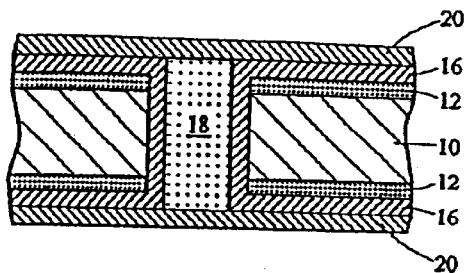
Figure 1F:
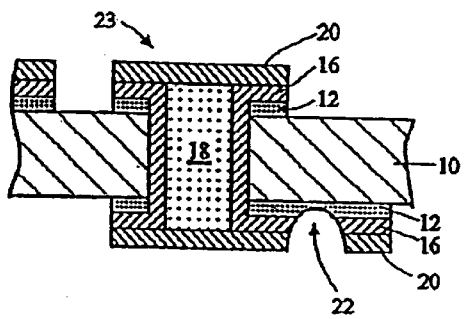
Figure 1G:
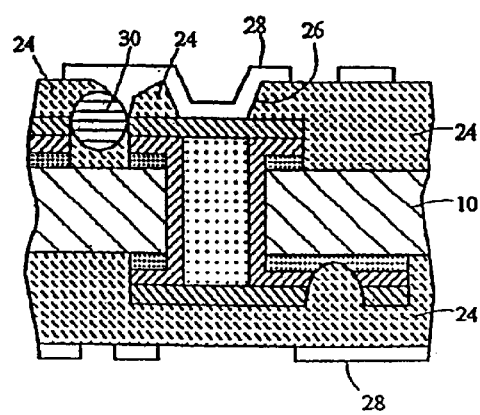

For a better understanding of the present invention, together with other and further objects, advantages and capabilities thereof, reference is made to the following disclosure and appended claims in connection with the above-described drawings. It is understood that like numerals may be used to indicate like elements from FIG. 1 to FIG. 3.

According to a method of the present invention, through holes are formed in a substrate having a copper foil on each of its main surfaces. After catalyzing treatment of the substrate, copper is deposited on the substrate, preferably by electroless plating. Then, the through holes are filled with an insulating material, and etching is performed to thin the copper layer on the surface of the substrate so that no part of the catalyst layer is exposed on the surface. Thereafter, the surface of the substrate is ground to remove the resin fill in the through holes that projects from the surface of the thinned copper layer to thereby level the substrate surface. Copper is deposited on the leveled substrate surface by plating, including the through hole regions. Following this, the copper layer on the surface is patterned or circuitized to form a wiring pattern. Since the copper layer on the surface of the substrate is thinned so that no part of the catalyst layer is exposed on the surface, a fine wiring pattern can be obtained without causing the problem of peeling of the wiring conductors, and the aforementioned short-circuit and air entrapment problems are substantially prevented.

A first embodiment of the present invention will now be described referring to FIG. 2. The same reference numerals as used in FIG. 1 are also used to identify similar elements in FIG. 2. Each step in FIG. 2 will now be explained in order. As above, FIG. 2(A) will be referred to as "step (A)", FIG. 2(B) as "step (B)", etc. It is understood that steps (A)–(G) referred to below refer only to those in FIG. 2, until the description begins of FIG. 3 (see below).

First, in step (A), a substrate 10, both main surfaces of which are covered with a metal (e.g., copper) foil 12 of a predetermined thickness, typically, 18 $\mu$m, is prepared. The substrate 10 is, for example, a composite circuit board formed of known laminated glass-epoxy sheets that include at least one internal wiring layer (not shown). A glass-epoxy substrate with no internal plane may also be used as the substrate 10. The thickness of the substrate 10, if it is a composite circuit board, is normally 0.4 mm to 1.6 mm. In step (B), a pattern of through holes 14 are formed in the substrate 10 at positions where through-hole connections are required according to the design specifications for the final product. Only one through hole 14 is shown in the FIG. for purposes of simplification. The diameter of through hole 14 is preferably 0.25 mm or more, for example, 0.30 mm, to facilitate its filling with a resin in step (D) described below. The substrate is treated with permanganate to roughen the inner wall of through holes 14 to increase adhesion of the subsequent metal (e.g., copper) layer to the inner wall, which is deposited by electroless plating in the next step (C).

In step (C), this plating process is performed to deposit a copper layer 16 on the inner wall of the through hole 14 and on the surfaces of the copper foils 12 on substrate 10. In this plating process, the substrate 10 is first immersed in a palladium-tin (Pd—Sn) colloidal solution to catalyze the inner wall of the through hole and the surfaces of the copper foils 12. Then, electroless or chemical plating is performed to deposit thin copper on the catalyzed layer surface, followed by electroplating to electrodeposit the copper film 16. The thickness of the electroplated outer copper film 16 is about 23 $\mu$m, for example, and that of the underlying copper deposited by the electroless plating is about 0.4 $\mu$m. At this time, the overall thickness of the layer of copper on the surfaces of substrate 10 is equivalent to the total of the thickness of the copper foil 12, the electroless plated copper layer and the electroplated copper film 16.

In step (D), the through hole 14 is filled with an insulating material 18, such as a resin. It is preferable that an epoxy resin is used, and that to reduce the coefficient of thermal expansion, the resin includes about 30–50 wt % of filler including silica particles, desirably, about 0.1 to 20 $\mu$m in diameter. Screen printing is preferably used to fill through hole 14 with resin 18. To facilitate the filling, the resin also preferably has a viscosity of about 200 to 500 poise. It is also desirable that the coefficient of thermal expansion of the resin after curing is about 50 ppm/degrees C. or less, preferably, about 20 ppm/degrees C.

Resin 18 is applied to completely fill through hole 14, as shown. Then, the surface of the substrate 10 is mechanically ground to remove any resin remaining on copper layer 16. A belt sander having an abrasive roughness of #400 grit is suitable for this mechanical reduction.

In step (D-1), the combined copper layer, comprising the aforementioned foil, electroless plated and electroplated copper layers, is etched and thinned so that only a thin (e.g., about 15 $\mu$m) copper layer 12' remains on the outer surface of substrate 10. Significantly, at this stage, the thickness of the layer of copper 12' remaining on the substrate is less than the original thickness of the copper foil 12 and the plated copper film 16 has been completely removed. Since this etching should be performed uniformly, a preferred etching apparatus is used that includes an array of nozzles for ejecting an etching liquid, such as cupric chloride. These nozzles are arranged on each of two spaced apart parallel planes and the substrate is moved between these planes. An example of an apparatus of this type is disclosed in U.S. Pat. No. 5,483,984.

It is important in the copper etching in step (D-1) to etch the copper layer so that the aforementioned catalyst layer used for the electroless plating in step (C) is never exposed on the surface. It has been found that if this catalyst layer is treated again with a catalyst and electroless-plated, the adhesion of the electroless-plated copper layer may be reduced, possibly causing peeling of the resulting wiring pattern. (In later step (E), another catalyst treatment is performed to deposit a copper layer 20 on layer 12'. Therefore, if the catalyst layer deposited in step (C) is exposed on the surface and is again treated with a catalyst in step (E), the adhesion of the electroless-plated copper layer may be reduced.)

In step (D-2), outwardly projecting portions 19 of the resin 18, which extend above the plane of the surface of copper layers 12', are mechanically ground by a belt sander (e.g., using an abrasive roughness of #800 grit) to level or planarize the surface of the substrate. In this fashion, resin-filled plated through hole 18' is obtained that has surfaces flush with the now much thinner copper layer 12'.

In step (E), copper film 20, which has a thickness of about 10 $\mu$m, is deposited on layers 12' and the ground external surface of resin 18, e.g., by plating. In the same way that plating for the through hole in step (C) was performed, the substrate is treated with a Pd—Sn catalyst and electroless-plated to deposit thin copper, and then electroplating is performed to form the resulting copper film 20. To ensure good electrical conduction, the thickness of the copper layer 20 is preferably about 10 $\mu$m or more.

The thickness of the copper layer (original layer 16) on the inner wall of the through hole 14 is approximately 23 $\mu$m. On the other hand, the thickness of the copper layer 12' in step (D-1) is about 15 $\mu$m, with the thickness of the plated copper film 20 being about 10 $\mu$m. The through hole copper is thus much thicker than either the thin copper layer 12' or the subsequently applied copper layer 20. Actually, however, since the thickness of the copper on the main surfaces of the substrate is reduced (e.g., about 2 to 3 $\mu$m) by the mechanical grinding in step (D-2) (and possibly by an additional buff grinding step to remove nodules following electroplating), the actual thickness of the copper on the surface of the substrate 10 after step (E) is approximately 22 $\mu$m. Thus, the thickness of the copper layer on the wall of the through hole is substantially equal to the thickness of the copper layer on the upper and lower surface of substrate 10.

In step (F), the copper layer comprised of copper layers 12' and 20 is circuitized to form a wiring pattern 23, using conventional (e.g., with photolithography) processing.

In step (G), a curtain coating process is used to apply an insulating layer 24 of photosensitive epoxy resin on the wiring pattern 23. The resin layer 24 is then leveled, and vias (openings) 26 formed as needed. The resin layer 24 is then plated with copper that is patterned or circuitized to form a second wiring pattern 28. Insulating layer 24 thus serves as an inner layer between both wiring (circuit) patterns. By repeating the application of resin, copper plating and patterning, a thin film wiring structure having an arbitrary number of layers can be formed.

As stated, the thickness of the surface copper after step (E) is approximately only 22 $\mu$m. This compares sharply with the foregoing conventional process wherein the thickness of the copper after step (E) is much greater, e.g., in one case, approximately 42 $\mu$m. Therefore, is according to the present invention, the final thickness of the copper is significantly reduced, and accordingly, the wiring density can be considerably increased. In addition, since the final thickness of the copper is so thin, e.g., less than 25 $\mu$m, it has been found that air entrapment is substantially prevented.

In the explanation of the embodiment in FIG. 2, the original thickness of the copper foil 12 on substrate 10 may be about 18 μm. However, before step (B) for drilling through holes is performed, the copper foil 12 may be etched to a lesser thickness (e.g., about 6 to 10 μm). In this case, assuming that in step (D-1) the remaining copper layer 12' is 15 μm thick, the etching is performed to leave a thinner portion of copper layer 16. In any case, it is imperative that the etching be controlled so that the catalyst layer is not exposed.

Figure 3A:
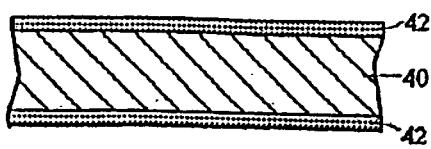
FIGS. 3(A)–3(J) are diagrams showing a method for fabricating a printed circuit board according to another embodiment of the present invention.
Figure 3B:
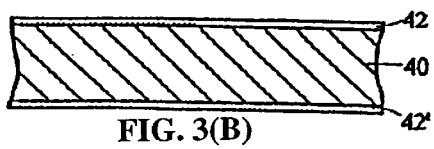
Figure 3C:
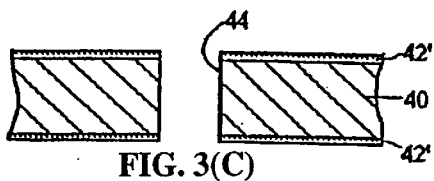
Figure 3D:
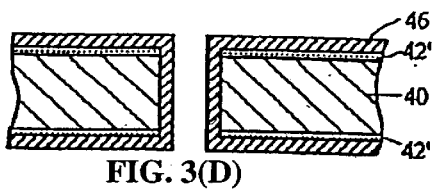
Figure 3E:
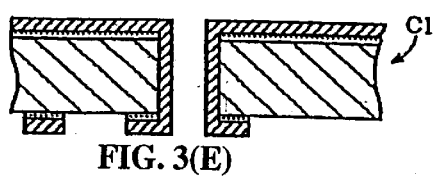
Figure 3F:
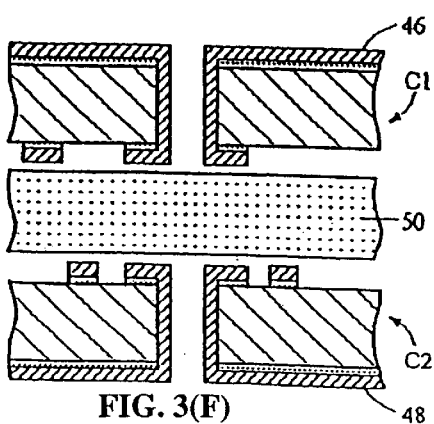
Figure 3G:
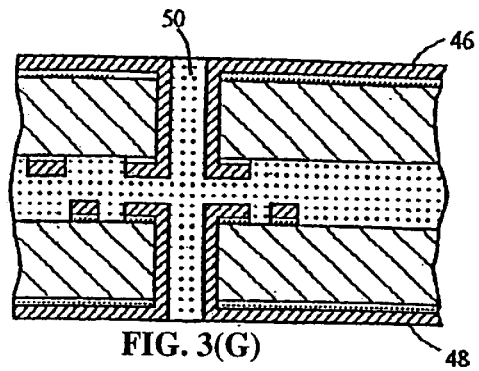
Figure 3H:
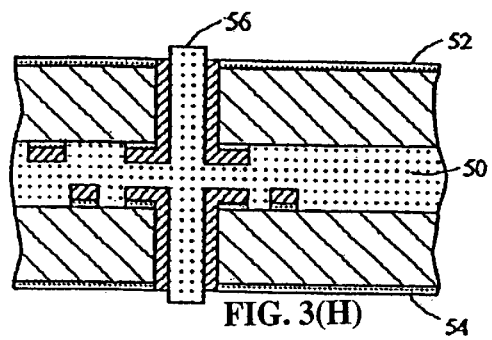
Figure 3I:
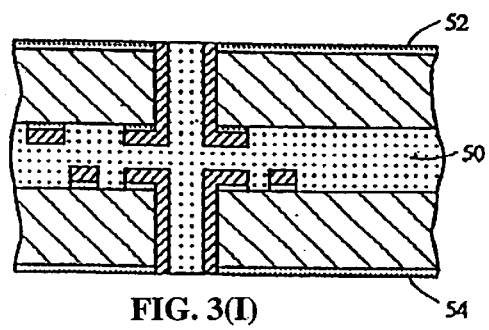
Figure 3J:
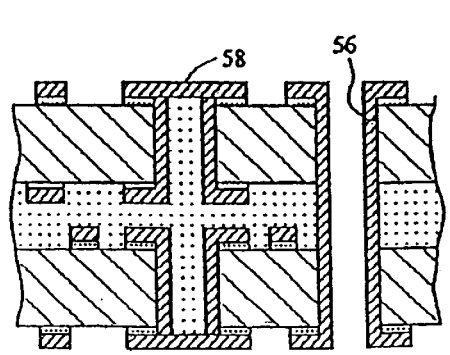

The present invention can be applied not only for a printed circuit board for which screen printing is used to fill the through holes with the described resin, but also for a circuit board for which lamination of core elements with prepreg therebetween is used to fill the substrate's through holes. FIG. 3 illustrates an embodiment for making such a substrate, and will now be described. As above, FIG. 3(A) is referred to as "step (A)", FIG. 3(B) as "step (B)", etc. It is understood that steps (A)–(J) referred to immediately below refer only to those in FIG. 3, and not FIG. 1 or 2.

In step (A), an insulating substrate 40, both surfaces of which are covered with about 18 μm thick copper foil 42, is prepared. In step (B), etching is used to reduce the thickness of the copper foil 42 to about 6 to 10 μm (10 μm in this embodiment). In step (C), through holes 44 are drilled. (Again, only one through hole 44 is shown in FIG. 3). In step (D), a copper layer 46 approximately 23 μm thick is deposited on the inner wall of the through hole 44 and on the thinned copper layer 42' of the substrate 40. For this plating process, Pd—Sn is used as the catalyst for treating the substrate 40, and electroless plating is used to deposit a copper layer. Then, electroplating is used to electrodeposit thick copper on the electroless plated copper layer.

In step (E), the copper layer on one surface (the bottom, or lower) of substrate 40 is circuitized to form a wiring pattern, so that a first core substrate or a laminated substrate C1 is prepared.

Similarly, a second core substrate C2 is prepared by processing another substrate in a similar manner to the first core substrate C1 and patterning the copper layer on the upper surface of the second substrate. The second core substrate C2 includes a plated copper layer 48 having the same thickness as the plated copper layer 46 on the first core substrate C1. In step (F), the first and the second core substrates C1 and C2 are laminated with the wiring patterns facing each other and a sheet of prepreg 50 sandwiched therebetween. Then, when heat and pressure are applied to press these components together, the prepreg 50 enters and fills the through holes 44. As a result, a composite circuit board shown in step (G) is obtained.

In step (H), the copper layers, 46 and 42', and 48 and 42', on the surfaces of the substrates are etched in the same manner as in step (D-1) in FIG. 2, so that remaining on the substrates are thin, e.g., about 15 μm thick, copper layers 52 and 54. In this embodiment, since the copper layer 42' is about 10 μm thick, the etching step in (H) is performed to leave a lower portion of the copper layers 46 and 48 unetched. Then, in step (I), in the same manner as in step (D-2) in FIG. 2, a belt sander is used to mechanically grind the surfaces of the substrates 40 to remove projecting prepreg portions 56.

In step (J), through holes 56 may be formed, and, as in step (D), Pd—Sn catalyzing, electroless plating and electroplating are performed to deposit a copper layer on the surfaces of the substrates 40. The copper layer is then circuitized to form a wiring pattern 58.

If fine patterning is not needed for the formation of wiring conductors on the core substrates C1 and C2, the thinning process in step (B) is not required. Regardless of whether the thinning process in step (B) is used, however, the etching in step (H) should be performed such that the catalyst layer is never exposed, as described above.

Since the thinning of the copper layer is so performed that the catalyst layer is not exposed, the peeling of wiring conductors does not occur and fine wiring patterns can be formed. In addition, the air trapping problem is substantially solved.

While the embodiments of the present invention have thus been described with reference to the drawings, it should be understood that the invention be not limited to the embodiments exemplified or illustrated in the drawings. In this manner, various modifications, alterations and changes may be made to the embodiments on the basis of knowledge of those skilled in the art without departing from the scope of the present invention.

What is claimed is:

1. A method of making a printed circuit board comprising the steps of:

providing a substrate having at least two opposing surfaces;

providing an initial copper layer on each of said opposing surfaces;

forming through holes in said substrate and through said initial copper layer, each of said through holes having inner walls;

treating said substrate with a catalyst to form a catalyzed layer on said substrate, including on said inner walls of said through holes;

forming a thicker copper layer by plating the treated surfaces of said substrate, including said inner walls of said through holes, with copper;

filling said through holes with an insulating material;

thinning said thicker copper layer on said at least one surface so that no part of said catalyzed layer is exposed through said thinned copper layer, said thinned copper layer having a thickness substantially less than that of said initial copper layer;

removing any insulating material projecting from the surface of said thinned copper layer to thereby level said at least one surface;

plating said at least one surface of said thinned copper layer and said insulating material with copper; and thereafter patterning the copper layer on said at least one surface to form a first wiring pattern.

2. The method according to claim 1, further comprising the steps of:

depositing an insulating layer on said formed first wiring pattern;

plating said insulating layer with a second layer of copper; and patterning said second layer of copper on said insulating layer to form a second wiring pattern.

3. The method according to claim 1, wherein the thickness of the copper layer of said first wiring pattern is about 25 μm or less.

4. The method according to claim 1 wherein said substrate is a composite circuit board having at least one internal wiring layer.

5. The method according to claim 1 wherein the thickness of said first wiring pattern is substantially equal to the thickness of the copper layer in each of said through holes.

6. The method according to claim 1, wherein said filling of said through holes is performed by screen printing.

7. The method according to claim 1, wherein said filling of said through holes is performed by sandwiching a prepreg between said substrate and another, similarly formed substrate, and heat-pressing the resultant laminate.

8. A method of making a printed circuit board comprising the steps of:

providing a substrate having at least two opposing surfaces;

providing an initial copper layer on each of said opposing surfaces;

forming through holes in said substrate and through said initial copper layer, each of said through holes having inner walls;

treating said substrate with a catalyst to form a catalyzed layer on said substrate, including on said inner walls of said through holes;

forming a thicker copper layer by plating the treated surfaces of said substrate, including said inner walls of said through holes, with copper;

filling said through holes with an insulating material;

thinning said thicker copper layer on said at least one surface so that no part of said catalyzed layer is exposed through said thinned copper layer, said thinned copper layer having a thickness greater than that of said initial copper layer;

removing any insulating material projecting from the surface of said thinned copper layer to thereby level said at least one surface;

plating said at least one surface of said thinned copper layer and said insulating material with copper; and thereafter patterning the copper layer on said at least one surface to form a first wiring pattern.

9. The method according to claim 8, further comprising the steps of:

depositing an insulating layer on said first formed wiring pattern;

plating said insulating layer with a second layer of copper; and patterning said second layer of copper on said insulating layer to form a second wiring pattern.

10. The method according to claim 8, wherein the thickness of the copper layer of said first wiring pattern is about 25 $\mu$m or less.

11. The method according to claim 8 wherein said substrate is a composite circuit board having at least one internal wiring layer.

12. The method according to claim 8 wherein the thickness of said first wiring pattern is substantially equal to the thickness of the copper layer in each of said through holes.

13. The method according to claim 8 wherein said filling of said through holes is performed by screen printing.

14. The method according to claim 8 wherein said filling of said through holes is performed by sandwiching a prepreg between said substrate and another, similarly formed substrate, and heat-pressing the resultant laminate.

* * * * *